(12) United States Patent
Han

(10) Patent No.: US 8,686,443 B2
(45) Date of Patent: Apr. 1, 2014

(54) ORGANIC LIGHT-EMITTING DISPLAY DEVICE

(75) Inventor: Byung-Uk Han, Cheonan-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 97 days.

(21) Appl. No.: 13/222,625

(22) Filed: Aug. 31, 2011

(65) Prior Publication Data

US 2012/0286295 A1 Nov. 15, 2012

(30) Foreign Application Priority Data

May 9, 2011 (KR) ........................ 10-2011-0043615

(51) Int. Cl.
*H01L 27/15* (2006.01)
*H01L 29/16* (2006.01)
*H01L 31/12* (2006.01)
*H01L 33/00* (2010.01)

(52) U.S. Cl.
USPC ................. 257/82; 257/E27.118; 438/29

(58) Field of Classification Search
None
See application file for complete search history.

(56) References Cited

U.S. PATENT DOCUMENTS

| 6,146,715 A * | 11/2000 | Kim et al. ................... 427/555 |
| 6,831,148 B2 * | 12/2004 | Buchecker et al. ........... 528/310 |
| 2007/0046191 A1* | 3/2007 | Saito ............................. 313/506 |
| 2011/0139225 A1 | 6/2011 | Boydell |

FOREIGN PATENT DOCUMENTS

| KR | 10-2003-0067174 | 8/2003 |
| KR | 10-2010-0062579 | 6/2010 |
| KR | 10-2010-0099504 | 9/2010 |
| KR | 10-2010-0108571 | 10/2010 |

* cited by examiner

*Primary Examiner* — Sonya D McCall Shepard
(74) *Attorney, Agent, or Firm* — Robert E. Bushnell, Esq.

(57) ABSTRACT

An organic light-emitting display device comprises a substrate including a plurality of light-emitting regions separated by a non-light-emitting region, an organic light-emitting element disposed on each of the light-emitting regions, and a photoactive element disposed on the non-light-emitting region.

23 Claims, 6 Drawing Sheets

ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on May 9, 2011 and there duly assigned Serial No. 10-2011-0043615.

BACKGROUND OF THE INVENTION

1. Field of the Invention

The present invention relates to an organic light-emitting display device, and more particularly, to an organic light-emitting display device including both a light-emitting element and a photoactive element.

2. Description of the Related Art

The rapid development of the information technology (IT) industry is dramatically increasing the use of display devices. Recently, there have been demands for display devices which are lightweight and thin, consume low power and provide high resolution. To meet these demands, liquid crystal displays or organic light-emitting displays using organic-light-emitting characteristics are being developed.

Organic light-emitting displays, which are next-generation display devices having self light-emitting characteristics, have better characteristics than liquid crystal displays in terms of viewing angle, contrast, response speed and power consumption, and can be manufactured to be thin and lightweight since a backlight is not required.

As mobile devices represented by smart phones are used in more diverse environments, with increased frequency, and for longer periods of time, it is urgently required to improve power consumption of display devices. Efforts are being continuously made to reduce power consumption by improving the efficiency of display devices and the efficiency of power supply devices. However, these efforts are not enough to meet the increasing demands for low power-consuming mobile devices.

SUMMARY OF THE INVENTION

The present invention provides an organic light-emitting display device which uses two energy sources to improve power consumption.

However, the present invention is not restricted to the one set forth herein. The present invention will become more apparent to one of ordinary skill in the art to which the present invention pertains by referencing the detailed description of the present invention given below.

According to an aspect of the present invention, an organic light-emitting display device comprises a substrate including a plurality of light-emitting regions separated by a non-light-emitting region, an organic light-emitting element disposed on each of the light-emitting regions, and a photoactive element disposed on the non-light-emitting region.

According to another aspect of the present invention, an organic light-emitting display device comprises a substrate including a plurality of light-emitting regions separated by a non-light-emitting region, a photoactive element disposed as a common layer on the light-emitting regions and the non-light-emitting region, and an organic light-emitting element disposed on each light-emitting region of the substrate and interposed between the substrate and the photoactive element.

According to another aspect of the present invention, an organic light-emitting display device comprises a substrate, a region defining film disposed on the substrate and defining a plurality of light-emitting regions and a photoactive region by exposing portions of the substrate through a plurality of apertures thereof, an organic light-emitting element disposed on each of the light-emitting regions, and a photoactive element disposed on the photoactive region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

The above and other features and advantages of the present invention will become more apparent by describing in detail exemplary embodiments thereof with reference to the attached drawings.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will filly convey the scope of the invention to those skilled in the art. Identical reference numbers indicate the same components throughout the specification. In the attached figures, the thickness of layers and regions is exaggerated for clarity.

It will also be understood that, when a layer is referred to as being "on" another layer or substrate, it can be directly on the other layer or substrate, or intervening layers may also be present. In contrast, when an element is referred to as being "directly on" another element, there are no intervening elements present.

Hereinafter, exemplary embodiments of the present invention will be described with reference to the attached drawings.

Figure 1:
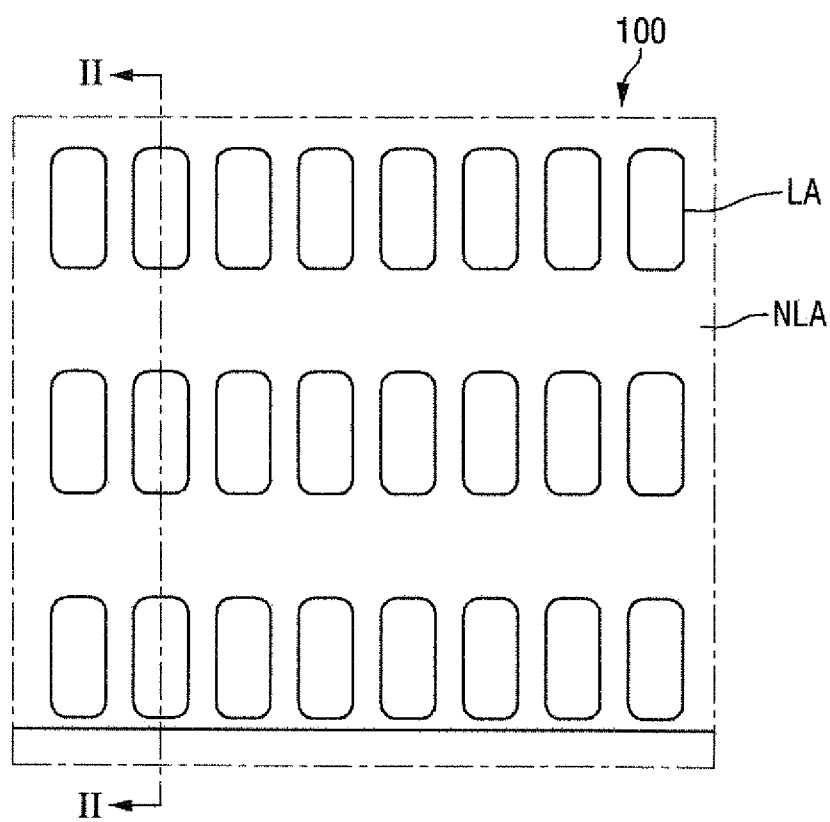
FIG. 1 is an enlarged plan view of a portion of an organic light-emitting display device according to an exemplary embodiment of the present invention.
Figure 2:
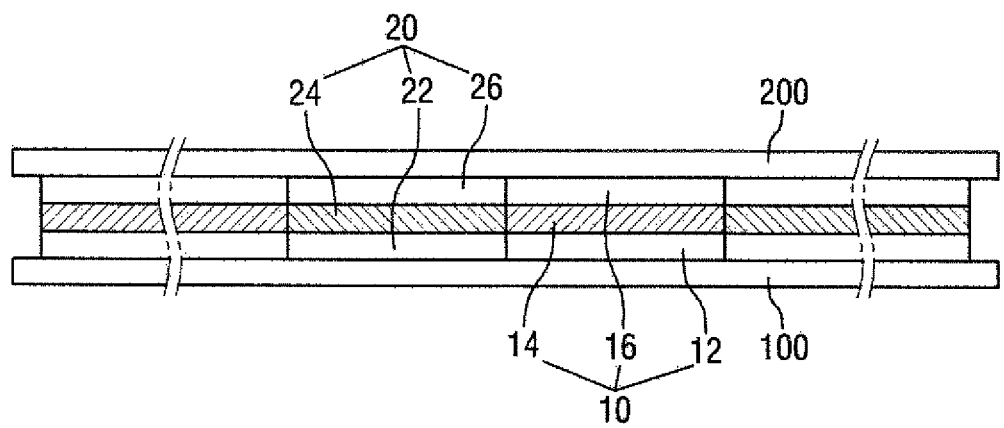
FIG. 2 is a schematic cross-sectional view taken along the line II-II of FIG. 1.

FIG. 1 is an enlarged plan view of a portion of an organic light-emitting display device according to an exemplary embodiment of the present invention, and FIG. 2 is a schematic cross-sectional view taken along the line II-II of FIG. 1.

Referring to FIGS. 1 and 2, the organic light-emitting display device according to the current exemplary embodiment comprises a first substrate 100, an organic light-emitting element 10 formed on each light-emitting region LA of the first substrate 100, a photoactive element 20 formed on a non-light-emitting region NLA of the first substrate 100, and a second substrate 200 facing the first substrate 100.

The first substrate 100 is divided into the non-light-emitting region NLA and a plurality of light-emitting regions LA separated by the non-light-emitting region NLA. The first substrate 100 may be a transparent insulating substrate made of glass, quartz, ceramic, or plastic. In addition, the first substrate 100 may consist of a single layer or multiple layers.

Various types of wirings and electrodes (such as data lines and gate lines) for driving the organic light-emitting display device may be formed on the first substrate 100. The wirings and electrodes formed on the first substrate 100 will be described later.

The first substrate 100 may be substantially transparent, and a ratio of the non-light-emitting region NLA to the light-emitting regions LA may be adjusted according to the intended luminance and transparency of the organic light-emitting display device. For example, the light-emitting regions LA and the non-light-emitting region NLA may be formed such that the proportion of the area of the non-light-emitting region NLA to the total area of the light-emitting regions LA and the non-light-emitting region NLA falls within a range of 20 to 90%, 40 to 60%, or 45 to 55%.

The second substrate 200 faces the first substrate 100 and seals an organic light-emitting layer 14 and a photoactive layer 24 between the first substrate 100 and the second substrate 200 from external air. Accordingly, the present invention may further include a sealing member (not shown) which attaches and seals the first substrate 100 and the second substrate 200 together. The sealing member (not shown) may be at least one material selected from the group consisting of acrylic resin, methacrylic resin, polyisoprene, vinyl resin, epoxy resin, urethane resin, and cellulose resin. The second substrate 200 may be a transparent insulating material made of glass, quartz, ceramic, or plastic and may consist of a single layer or multiple layers. The second substrate 200 may be the same material as the first substrate 100.

The organic light-emitting element 10 is formed on each light-emitting region LA of the first substrate 100. The organic light-emitting element 10 may include a first pixel electrode 12, the organic light-emitting layer 14 formed on the first pixel electrode 12, and a second pixel electrode 16 formed on the organic light-emitting layer 14.

Each first pixel electrode 12 is connected to a separate wiring electrode so as to supply a current of a different magnitude to a corresponding organic light-emitting layer 14. Each second pixel electrode 16 may be electrically connected to another second pixel electrode so as to serve as a common electrode. The first pixel electrode 12 may be an anode which injects holes into the organic light-emitting layer 14, and the second pixel electrode 16 may be a cathode which injects electrons into the organic light-emitting layer 14. However, the present invention is not limited thereto. Depending on the method of driving the organic light-emitting display device, the first pixel electrode 12 can be a cathode, and the second pixel electrode 16 can be an anode. In addition, the first pixel electrode 12 can be a common electrode.

The organic light-emitting layer 14 is interposed between the first pixel electrode 12 and the second pixel electrode 16. Holes and electrons injected from the first pixel electrode 12 and the second pixel electrode 16 combine together to form excitons in the organic light-emitting layer 14. As the excitons transit from an excited state to a ground state, their energy level changes, and the organic light-emitting layer 14 emits light of a color corresponding to the changed energy level.

The organic light-emitting layer 14 may be made of a low or high molecular weight organic material. The organic light-emitting layer 14 may consist of multiple layers including a hole injecting layer, a hole transporting layer, an emitting layer, an electron transporting layer and an electron injecting layer. The hole injecting layer, the hole transporting layer, the emitting layer, the electron transporting layer and the electron injecting layer may be stacked sequentially on the first pixel electrode 12 which is an anode.

The photoactive element 20 is formed on the non-light-emitting region NLA of the first substrate 100 and may include a first common electrode 22, the photoactive layer 24 formed on the first common electrode 22, and a second common electrode 26 formed on the photoactive layer 24.

Each first common electrode 22 may be electrically connected to another first common electrode, and each second common electrode 26 may be electrically connected to another second common electrode. In addition, the first common electrode 22 may be an anode which receives holes from the photoactive layer 24, and the second common electrode 26 may be a cathode which receives electrons from the photoactive layer 24. However, the present invention is not limited thereto. The first common electrode 22 can be a cathode, and the second common electrode 26 can be an anode, depending on the method of driving the organic light-emitting device.

The photoactive layer 24 is interposed between the first common electrode 22 and the second common electrode 26. The photoactive layer 24 may have a multilayer structure in which a donor and an acceptor are stacked or a bulk-heterojunction structure in which the donor and the acceptor are blended. In some cases, the bulk-heterojunction structure having a blend of the donor and the acceptor may be interposed between a donor layer and an acceptor layer. In addition, the hole transporting layer, as a buffer layer, may be disposed between the anode and the photoactive layer 24, and the electron transporting layer, as a buffer layer, may be disposed between the cathode and the photoactive layer 24. In this regard, a material selected for the photoactive layer 24 may primarily have a light absorption wavelength range which is close to the sunlight spectrum and may exhibit very high light absorption properties and superior electrical properties (e.g., charge mobility). The acceptor should have greater electron affinity than the donor. However, the donor and acceptor materials are relative expressions and can be reversed in some cases. In addition, an organic semiconductor used for the photoactive layer 24 includes an organic monomer and an organic polymer. The organic monomer may be formed by a vacuum deposition process in which it is heated in vacuum so as to successively or simultaneously form the donor layer and the acceptor layer. The organic polymer may be formed by performing a wet-etching process, such as spin coating, inkjet coating, screen printing, doctor blade, slit coating, flow coating or roll-to-roll coating, on a solution in which the donor and the acceptor are dissolved.

External light incident on the display device or part of light generated and leaked from the light-emitting regions LA is absorbed by the photoactive element 20 and converted into electrical energy. In addition, a current generated by the photoactive element 20 is supplied to the organic light-emitting element 10. That is, part of power supplied to the organic light-emitting element 10 may be provided by another energy source such as external light. Accordingly, this can improve power consumption characteristics of the organic light-emitting display device.

Furthermore, the photoactive element 20 is placed on the non-light-emitting region NLA of the first substrate 100 so as to be parallel to the organic light-emitting element 10. Such placement of the photoactive element 20 can improve the power consumption characteristics of the organic light-emitting display device without degrading display characteristics (such as luminance and definition) of the organic light-emitting element 10.

The organic light-emitting display device according to the current exemplary embodiment may further include an auxiliary power supply portion (not shown) which collects and stores power generated by the photoactive element 20 and supplies the power to the organic light-emitting element 10.

Hereinafter, other exemplary embodiments of the present invention will be described. In the following embodiments, elements substantially identical to those of the above-described embodiment are indicated by like reference numerals, and any repetitive description thereof will be omitted.

Figure 3:
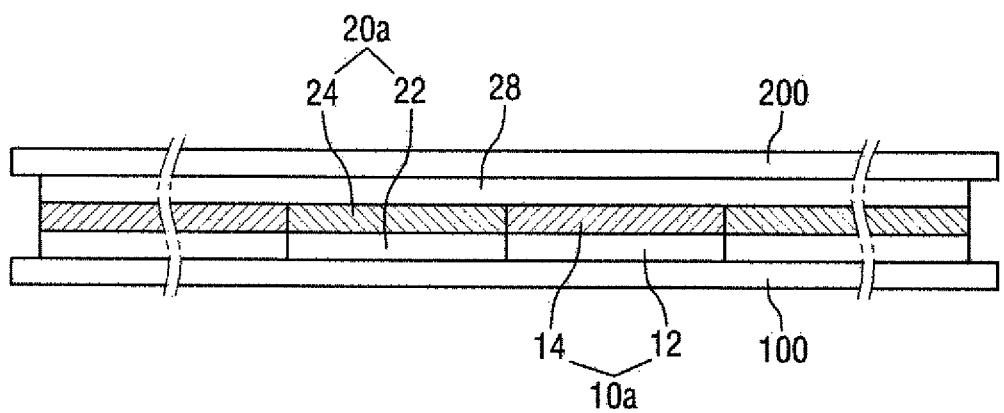
FIG. 3 is a schematic cross-sectional view of an organic light-emitting display device according to another exemplary embodiment of the present invention.

FIG. 3 is a schematic cross-sectional view of an organic light-emitting display device according to another exemplary embodiment of the present invention. Referring to FIG. 3, the organic light-emitting display device according to the current exemplary embodiment includes a first substrate 100, an organic light-emitting element 10a formed on each light-emitting region LA of the first substrate 100, a photoactive element 20a formed on a non-light-emitting region NLA of the first substrate 100, a second common electrode 28, and a second substrate 200.

The organic light-emitting display device according to the current exemplary embodiment is different from the organic light-emitting display device according to the previous exemplary embodiment of FIG. 2 in that the second common electrode 28 is a common electrode of an organic light-emitting layer 14 and a photoactive layer 24. Accordingly, the organic light-emitting element 10a of the organic light-emitting display device according to the current exemplary embodiment includes a first pixel electrode 12 and the organic light-emitting layer 14 formed on the first pixel electrode 12, and the photoactive element 20a includes a first common electrode 22 and the photoactive layer 24 formed on the first common electrode 22.

That is, the second common electrode 28, which is a common electrode of the organic light-emitting layer 14 and the photoactive layer 24, supplies electric charges generated and collected by the photoactive layer 24 to the organic light-emitting layer 14.

The photoactive element 20a is placed on the non-light-emitting region NLA of the first substrate 100 so as to be parallel to the organic light-emitting element 10a. Such placement of the photoactive element 20a can improve power consumption characteristics of the organic light-emitting display device without degrading display characteristics of the organic light-emitting element 10a.

In addition, since the second common electrode 28 can be integrally formed on the photoactive layer 24 and the organic light-emitting layer 14 using an open mask, the process of forming the second common electrode 28 can be simplified.

Figure 4:
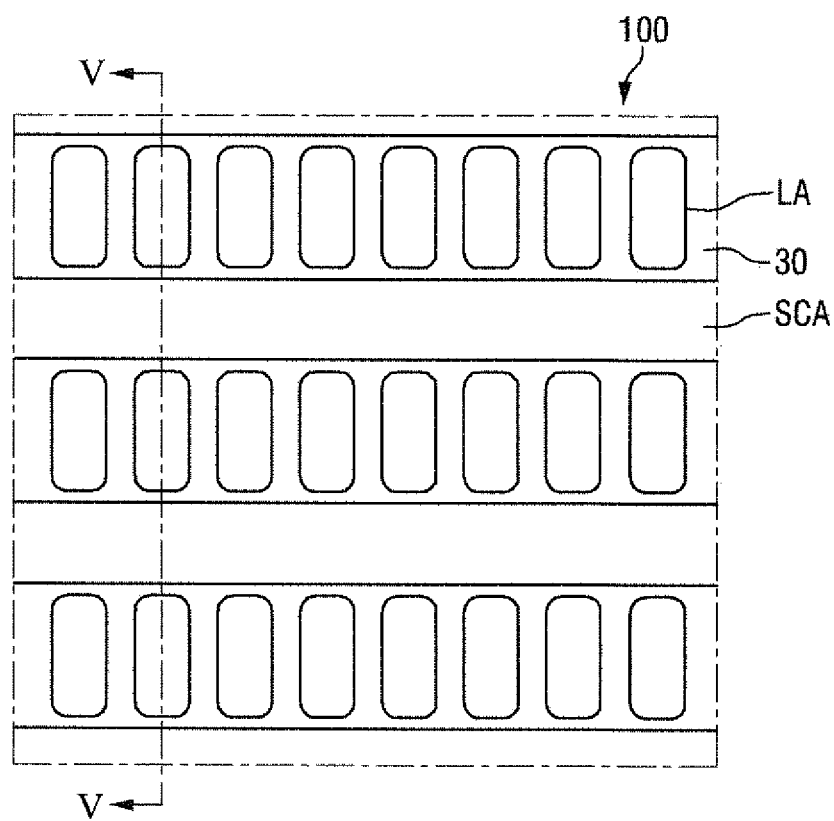
FIG. 4 is an enlarged plan view of a portion of an organic light-emitting display device according to another exemplary embodiment of the present invention.
Figure 5:
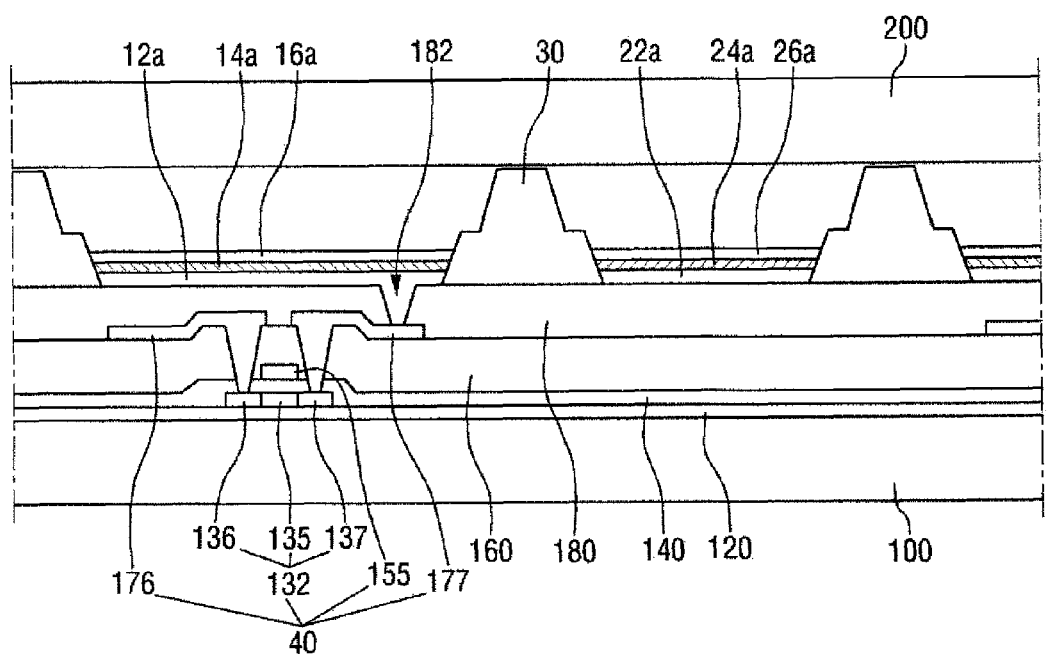
FIG. 5 is a cross-sectional view taken along the line V-V of FIG. 4.

FIG. 4 is an enlarged plan view of a portion of an organic light-emitting display device according to another exemplary embodiment of the present invention. FIG. 5 is a cross-sectional view taken along the line V-V of FIG. 4.

Referring to FIG. 4, the organic light-emitting display device according to the current exemplary embodiment is divided into a plurality of light-emitting regions LA and a photoactive region SCA. The photoactive region SCA is divided into a plurality of sections by a region defining film 30, and each section of the photoactive region SCA is situated between rows of the light-emitting regions LA.

The region defining film 30 includes a plurality of apertures which expose the light-emitting regions LA and the photoactive region SCA, and which defines the light-emitting region LA of each organic light-emitting element 10 and the photoactive region SCA. The organic light-emitting element 10 is formed in each of the light-emitting regions LA, and a photoactive element 20 is formed in the photoactive region SCA.

The region defining film 30 may be formed by a photo process or a photolithography process using a photosensitive material. The region defining film 30 may be a resin (such as polyacrylic resin or polyimide resin)-based or silica-based inorganic material.

More specifically, referring to FIG. 5, the organic light-emitting display device according to the current exemplary embodiment includes a buffer layer 120 formed on a substrate, a driving semiconductor layer 132, a gate insulating film 140, an interlayer insulating film 160, a planarization film 180, an organic light-emitting layer 14a, a photoactive layer 24a, and various conducting wirings and electrodes.

The buffer layer 120 is formed on the substrate. The buffer layer 120 prevents penetration of impurity elements into the substrate, and planarizes the surfaces of the substrate. The buffer layer 120 may be made of various materials which can perform these functions. For example, the buffer layer 120 may be any one of a $SiN_x$ layer, a $SiO_2$ layer, and a $SiO_xN_y$ layer. The buffer layer 120 is not essential and can be omitted, depending on the type of the substrate and processing conditions.

The driving semiconductor layer 132 is formed on the buffer layer 120. The driving semiconductor layer 132 may be made of an amorphous silicon film or a polycrystalline silicon film. However, the polycrystalline silicon film is preferred. In addition, the driving semiconductor layer 132 includes a channel region which is undoped with impurities, and a source region 136 and a drain region 137 which are formed on both sides of the channel region and which are p+-doped. In this regard, an ion material used to dope the source and drain regions 136 and 137, respectively, is P-type impurities such as boron (B). In particular, B2H6 is mostly used. The impurities may vary according to the type of thin-film transistor (TFT).

The gate insulating film 140 is formed of $SiN_x$ or $SiO_2$ on the driving semiconductor layer 132. A gate wiring, including a driving gate electrode, is formed on the gate insulating film 140. The gate wiring further includes a gate line (not shown), a first sustain electrode, and other wirings. The driving gate electrode overlaps at least part (in particular, the channel region) of the driving semiconductor layer 132.

The interlayer insulating film 160 covering the driving gate electrode is formed on the gate insulating film 140. Through holes are formed in both the gate insulating film 140 and the interlayer insulating film 160 so as to expose the source region 136 and the drain electrode 137 of the driving semiconductor layer 132. Like the gate insulating film 140, the interlayer insulating film 160 may be made of $SiN_x$ or $SiO_2$.

A data wiring, including a driving source electrode 176 and a driving drain electrode 177, is formed on the interlayer insulating film 160. The data wiring further includes a data line (not shown), a common power supply line (not shown), a second sustain electrode, and other wirings. The driving source electrode 176 and the driving drain electrode 177 are connected to the source region 136 and the drain region 137, respectively, of the driving semiconductor layer 132 by the through holes.

In this way, a driving TFT 40 including the driving semiconductor layer 132, the driving gate electrode, the driving source electrode 176 and the driving drain electrode 177 is formed.

The planarization film 180 covering the data wiring is formed on the interlayer insulating film 160. The planarization film 180 planarizes steps to increase light-emitting efficiency of the organic light-emitting element 10 which is to be formed on the planarization film 180.

The planarization film 180 includes a contact hole 182 which exposes a portion of the driving drain electrode 177.

The planarization film 180 may be made of one or more materials selected from polyacrylates resin, epoxy resin, phenolic resin, polyamides resin, polyimides resin, unsaturated polyesters resin, poly phenylenethers resin, poly phenylenesulfides resin, and benzocyclobutene (BCB).

The organic light-emitting element 10 is formed on the planarization film 180 in each light-emitting region LA, and the photoactive element 20 is formed in the photoactive region SCA of a non-light-emitting region NLA.

The organic light-emitting element 10 includes a first pixel electrode 12a, an organic light-emitting layer 14a, and a second pixel electrode 16a stacked sequentially. The first pixel electrode 12a may be connected to the driving drain electrode 177 by the contact hole 182 of the planarization film 180, and each second pixel electrode 16a may be electrically connected to another second pixel electrode so as to serve as a common electrode.

The photoactive element 20 includes a first common electrode 22a, a photoactive layer 24a, and a second common electrode 26a stacked sequentially. The first common electrode 22a may be electrically connected to another first common electrode, and the second common electrode 26a may be electrically connected to another second common electrode.

The driving TFT 40, including the driving gate electrode, the driving source electrode 176, the driving drain electrode 177, the first sustain electrode, the second sustain electrode, the gate line (not shown), the data line (not shown) and the common power supply line (not shown), may be disposed in each light-emitting region LA so as to be overlapped by the first pixel electrode 12a. Accordingly, the non-light-emitting region NLA may be more transparent than each light-emitting region LA, and the photoactive efficiency of the photoactive layer 24a may increase. That is, various conducting wires and transistors needed to drive the organic light-emitting display device may be concentrated in the light-emitting regions LA in order to prevent a loss of light incident on the photoactive region SCA due to reflection or scattering. Consequently, this can increase the efficiency of the photoactive element 20.

The first pixel electrode 12a, the second pixel electrode 16a, the first common electrode 22a, and the second common electrode 26a may be made of a reflective conductive material, a transparent conductive material or a semi-transparent conductive material.

Examples of the reflective conductive material include Li, Ca, LiF/Ca, LiF/Al, Al, Ag, Mg, and Au. Examples of the transparent conductive material include indium tin oxide (ITO), indium zinc oxide (IZO), ZnO, and indium oxide ($In_2O_3$).

The semi-transparent conductive material may be a co-deposition material containing one or more of Mg and Ag, or it may be one or more of Mg, Ag, Ca, Li, and Al.

Figure 6:
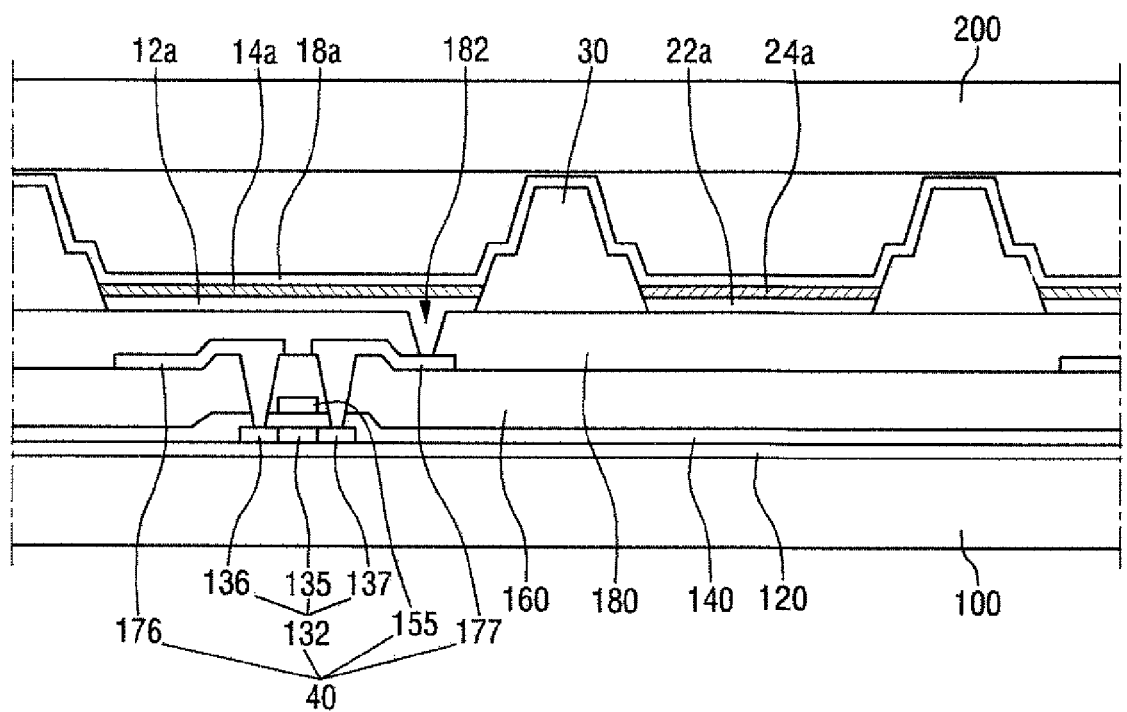
FIG. 6 is a cross-sectional view of an organic light-emitting display device according to another exemplary embodiment of the present invention.

FIG. 6 is a cross-sectional view of an organic light-emitting display device according to another exemplary embodiment of the present invention.

Referring to FIG. 6, the organic light-emitting display device according to the current exemplary embodiment is different from the organic light-emitting display device according to the previous exemplary embodiment of FIG. 5 in that an organic light-emitting element 10 includes a pixel electrode 12a formed on each light-emitting region LA of a first substrate 100 and an organic light-emitting layer 14a formed on the pixel electrode 12a, in that a photoactive element 20 includes a first common electrode 22a formed on a non-light-emitting region NLA of the first substrate 100 and a photoactive layer 24a formed on the first common electrode 22a, and in that a second common electrode 18a is formed on the organic light-emitting layer 14a and the photoactive layer 24a.

That is, the second common electrode 18a, which is a common electrode of the organic light-emitting layer 14a and the photoactive layer 24a, supplies electric charges generated and collected by the photoactive layer 24a to the organic light-emitting layer 14a.

Elements substantially identical to those of the above-described embodiments are indicated by like reference numerals, and any repetitive description thereof is omitted.

Figure 7:
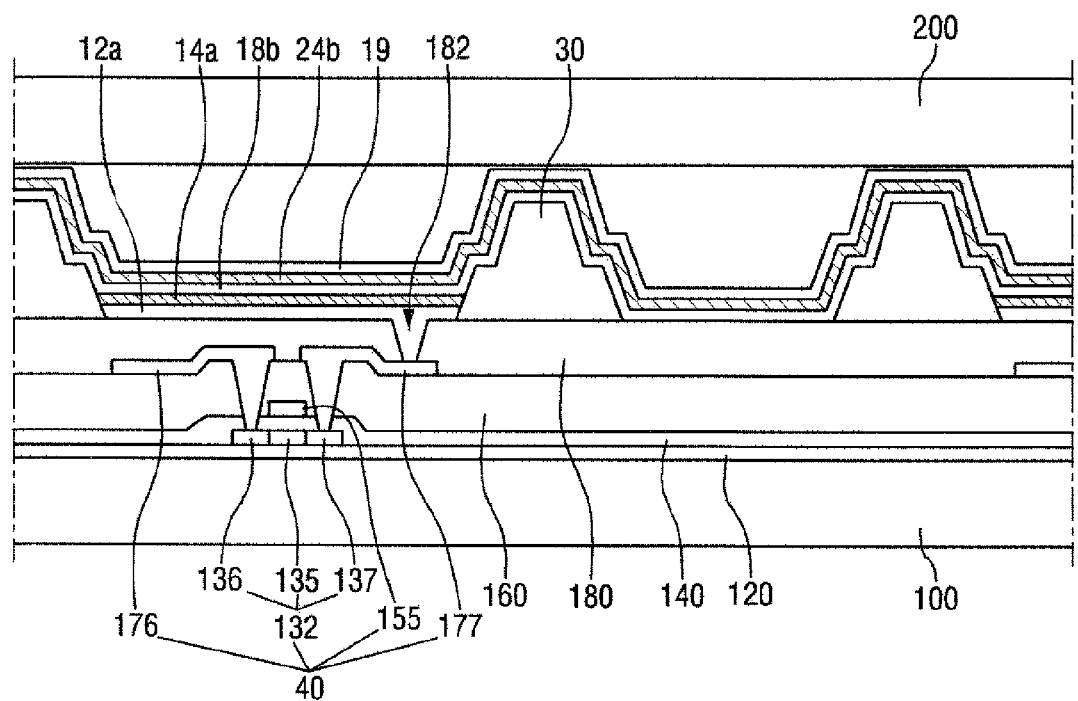
FIG. 7 is a cross-sectional view of an organic light-emitting display device according to another exemplary embodiment of the present invention.

FIG. 7 is a cross-sectional view of an organic light-emitting display device according to another exemplary embodiment of the present invention.

Referring to FIG. 7, the organic light-emitting display device according to the current exemplary embodiment is different from the organic light-emitting display device according to the previous exemplary embodiment of FIG. 6 in that a photoactive layer 24b is formed on a second common electrode 18b, and in that a third common electrode 19 is further provided on the photoactive layer 24b.

That is, the photoactive layer 24b is formed as a common layer on the whole surface of light-emitting regions LA and a non-light-emitting region NLA of a substrate, thus rendering the organic light-emitting display device more photoactive.

When the second common electrode 18b is a cathode, a first pixel electrode 12a, a first common electrode 22a, and the third common electrode 19 are anodes. When the second common electrode 18b is an anode, the first pixel electrode 12a, the first common electrode 22a and the third common electrode 19 are cathodes.

Elements substantially identical to those of the above-described embodiments are indicated by like reference numerals, and any repetitive description thereof is omitted.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. An organic light-emitting display device, comprising:
   a substrate including a plurality of light-emitting regions separated by a non-light-emitting region;
   an organic light-emitting element disposed on each of the light-emitting regions; and
   a photoactive element generating electricity when the photoactive element is exposed to light, disposed on the non-light-emitting region.

2. The display device of claim 1, wherein the organic light-emitting element comprises;
   a first pixel electrode formed on each light-emitting region of the substrate;
   an organic light-emitting layer formed on the first pixel electrode; and a second pixel electrode formed on the organic light-omitting layer.

3. The display device of claim 1, wherein the photoactive element comprises:
   a first common electrode formed on the non-light-emitting region of the substrate;
   a first photoactive layer formed on the first common electrode; and
   a second common electrode formed on the first photoactive layer.

4. The display device of claim 1, wherein the organic light-emitting element comprises a pixel electrode formed on each fight-emitting region of the substrate and an organic light-emitting layer formed on the pixel electrode, and wherein the photoactive element comprises a first Common electrode formed on the non-light-emitting region of the substrate, a first photoactive layer formed on the first common electrode, and a second common electrode formed on the organic light-emitting layer and the first photoactive layer.

5. The display device of claim 4, further comprising:
   a second photoactive layer formed on the second common electrode; and
   a third common electrode formed on the second photoactive layer.

6. The display device of claim 1, wherein a proportion of an area of the non-light-emitting region to a total area of the light-emitting regions and the non-light-emitting region falls within a range of 20 to 90%.

7. The display device of claim 1, further comprising an auxiliary power supply portion for receiving power from the photoactive element and for supplying the power to the organic light-emitting element.

8. The display device of claim 1, further comprising a thin-film transistor formed between the substrate and the organic light-emitting element, wherein the thin-film transistor is overlapped by the organic light-emitting element.

9. The display device of claim 1, wherein the substrate is one of a transparent material and a semi-transparent material.

10. An organic light-emitting display device, comprising:
    a substrate including a plurality of light-emitting regions separated by a non-light-emitting region;
    a photoactive element disposed as a common layer on the light-emitting regions and the non-light-emitting region; and
    an organic light-emitting element disposed on each light-emitting region of the substrate and interposed between the substrate and the photoactive element.

11. The display device of claim 10, wherein the organic light-emitting element comprises a pixel electrode formed on each light-emitting region of the substrate and an organic light-emitting layer formed on the pixel electrode, and wherein the photoactive element comprises a first common electrode disposed on the organic light-emitting layer and formed on a whole surface of the light-emitting regions and the non-light-emitting region of the substrate, a photoactive layer formed on the first common electrode, and a second common electrode formed on the photoactive layer.

12. The display device of claim 10, wherein a proportion of an area of the non-light-emitting region to a total area of the light-emitting regions and the non-light-emitting region falls within as range of 20 to 90%.

13. The display device of claim 10, further comprising an auxiliary power supply portion for receiving power from the photoactive element and for supplying the power to the organic light-emitting element.

14. The display device of claim 10, further comprising a thin-film transistor formed between the substrate and the organic light-emitting element, wherein the thin-film transistor is overlapped by the organic light-emitting element.

15. An organic light-emitting display device, comprising:
    substrate;
    a region defining film disposed on the substrate and defining a plurality of light-emitting regions and a photoactive region by exposing portions of the substrate through a plurality of apertures thereof,
    an organic light-emitting element disposed on each of the light-emitting regions; and
    a photoactive element generating electricity when the photoactive element is exposed to light, disposed on the photoactive region.

16. The display device of claim 15, wherein the organic light-emitting element comprises:
    a first pixel electrode formed on each light-emitting region of the substrate;
    an organic light-emitting layer formed on the first pixel electrode; and
    a second pixel electrode formed on the organic light-emitting layer.

17. The display device of claim 15, wherein the photoactive element comprises:
    a first common electrode formed on the photoactive region of the substrate;
    a first photoactive layer formed on the first common electrode; and
    a second common electrode formed on the first photoactive layer.

18. The display device of claim 15, wherein the organic light-emitting element comprises a pixel electrode formed on each light-emitting region of the substrate and an organic light-emitting layer formed on the pixel electrode, and wherein the photoactive element composes a first common electrode formed on the photoactive region of the substrate, a first photoactive layer formed on the first common electrode, and a second common electrode formed on the organic light-emitting layer and the first photoactive layer.

19. The display device of claim 15, further comprising:
    as second photoactive layer formed on the second common electrode; and
    a third common electrode formed on the second photoactive layer.

20. The display device of claim 15, wherein a proportion of an area of the non-light-emitting region to a total area of the light-emitting regions and the photoactive region falls within a range of 20 to 90%.

21. The display device of claim 15, further comprising an auxiliary power supply portion for receiving power from the photoactive element and for supplying the power to the organic light-emitting element.

22. The display device of claim 15, further comprising a thin-film transistor formed between the substrate and the organic light-emitting element, wherein the thin-film transistor is overlapped by the organic light-emitting element.

23. The display device of claim 15, wherein the substrate is one of a transparent material and a semi-transparent material.

* * * * *